United States Patent
Eberler et al.

(10) Patent No.: US 11,609,288 B2
(45) Date of Patent: Mar. 21, 2023

(54) MAGNETIC RESONANCE APPARATUS WITH A LIGHTING APPARATUS

(71) Applicant: Siemens Healthcare GmbH, Erlangen (DE)

(72) Inventors: Ludwig Eberler, Neumarkt (DE); Markus Vester, Nuremberg (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/479,068

(22) Filed: Sep. 20, 2021

(65) Prior Publication Data
US 2022/0091204 A1   Mar. 24, 2022

(30) Foreign Application Priority Data

Sep. 21, 2020 (DE) .......................... 102020211776.4

(51) Int. Cl.
*G01R 33/36* (2006.01)
*G01R 33/28* (2006.01)

(52) U.S. Cl.
CPC ....... *G01R 33/3685* (2013.01); *G01R 33/283* (2013.01)

(58) Field of Classification Search
CPC .. G01R 33/28; G01R 33/283; G01R 33/3685; A61B 2090/309; A61B 2090/35
See application file for complete search history.

(56) References Cited

U.S. PATENT DOCUMENTS

| | | | | |
|---|---|---|---|---|
| 2005/0254256 A1* | 11/2005 | Gosswein | ............... | A61B 5/055 362/572 |
| 2009/0262551 A1* | 10/2009 | Trowell | ................ | G01R 33/28 362/253 |
| 2010/0181916 A1* | 7/2010 | Mondloch | ............... | F21V 29/89 315/294 |
| 2010/0191069 A1* | 7/2010 | Fisher | .................. | A61B 5/7203 600/300 |
| 2016/0144168 A1* | 5/2016 | Tol | ........................ | A61N 1/3718 607/45 |
| 2017/0234949 A1* | 8/2017 | Kim | .................... | G01R 33/3692 324/309 |

FOREIGN PATENT DOCUMENTS

EP    3796021 A1    3/2021

OTHER PUBLICATIONS

Office Action dated Jun. 21, 2021 issued for German Patent Application No. 102020211776.4.

* cited by examiner

*Primary Examiner* — Steven L Yeninas
(74) *Attorney, Agent, or Firm* — Banner & Witcoff Ltd.

(57) ABSTRACT

A magnetic resonance apparatus including: a scanner; a patient receiving region which is at least partially surrounded by the scanner; and a lighting apparatus designed to light the patient receiving region. The lighting apparatus includes at least one lighting element; and two neutralizing elements designed to at least partially neutralize a voltage that is induced by a high-frequency field of the scanner.

20 Claims, 2 Drawing Sheets

MAGNETIC RESONANCE APPARATUS WITH A LIGHTING APPARATUS

TECHNICAL FIELD

The present disclosure relates to a magnetic resonance apparatus comprising a scanner unit, a patient receiving region which is surrounded at least partially by the scanner unit, and a lighting apparatus with at least one lighting element, said lighting apparatus being designed to light the patient receiving region.

BACKGROUND

For the purpose of a magnetic resonance examination, the patient, in particular that region of the patient which is to be examined, is situated inside the patient receiving region of the magnetic resonance apparatus. In order to make the time inside the patient receiving region pleasant for the patient during the magnetic resonance examination, provision is made for lighting the patient receiving region. The lighting of the patient receiving region is effected by means of a lighting apparatus of the magnetic resonance apparatus, said lighting apparatus being arranged inside the patient receiving region. As a result of this arrangement, the lighting apparatus, in particular a lighting element of the lighting apparatus, is however also exposed to a high-frequency field (HF field) of a high-frequency antenna of the magnetic resonance apparatus. This can lead to interference in the lighting operation of the lighting apparatus.

In order to compensate and/or neutralize said interference, provision is conventionally made for connecting a capacitor in parallel with each lighting element (e.g. LED) arranged inside the patient receiving region. A capacitance of the capacitor forms a short circuit for the HF field in this type of configuration, and therefore reduces the high-frequency voltage that is induced in the circuitry of the lighting apparatus. Therefore the high-frequency voltage applied to the lighting element is also reduced. However, such an embodiment of a lighting apparatus has the disadvantage that the lighting element and the capacitor cover an area through which the high-frequency field acts, and therefore an interference voltage is induced by the HF field over this small area between lighting element and capacitor.

SUMMARY

An object of the present disclosure is in particular to allow interference-free lighting of a patient receiving region during a magnetic resonance examination.

The disclosure takes as its starting point a magnetic resonance apparatus comprising a scanner unit, a patient receiving region which is surrounded at least partially by the scanner unit, and a lighting apparatus with at least one lighting element, said lighting apparatus being designed to light the patient receiving region.

According to the disclosure, the lighting apparatus has two neutralizing elements for the purpose of at least partially neutralizing a voltage that is induced by a high-frequency field of the scanner unit.

The scanner unit preferably comprises a detector unit, in particular a magnet unit, for capturing medical and/or diagnostic image data. In this context, the scanner unit, in particular the magnet unit, preferably comprises a basic magnet, a gradient coil unit and a high-frequency antenna unit. A strong homogeneous and constant basic magnetic field is generated by means of the basic magnet. High-frequency magnetic resonance sequences are directed into the patient receiving region by means of the high-frequency antenna unit, and a high-frequency field (HF field) is therefore generated within the region surrounded by the high-frequency antenna unit.

The patient receiving region is preferably surrounded at least partially by the scanner unit. For example, the patient receiving region can be cylindrical and/or surrounded cylindrically by the scanner unit. The scanner unit can have a shell which surrounds the patient receiving region in this case. Such a shell can also be designed as an integrated and/or integral part of the high-frequency antenna unit of the scanner unit. A field of view (FOV) and/or isocenter of the magnetic resonance apparatus is preferably disposed within the patient receiving region. The FOV preferably comprises a scanning region of the magnetic resonance apparatus, within which ideal conditions for capturing medical image data are present in the patient receiving region. The isocenter of the magnetic resonance apparatus preferably comprises that region and/or point within the magnetic resonance apparatus which has the optimal and/or most ideal conditions for the capture of medical image data. For example, the isocenter comprises the most homogeneous basic magnetic field region within the magnetic resonance apparatus.

For the purpose of a magnetic resonance examination, the patient, in particular that region of the patient which is to be examined, is arranged and/or positioned inside the patient receiving region. In order to achieve this, the patient is first positioned on the patient table. The patient table together with the patient positioned thereon is then moved into the patient receiving region until that region of the patient which is to be examined is arranged in the FOV and/or at the isocenter of the magnetic resonance apparatus, in particular the scanner unit. The patient table has a supporting region with a supporting surface for the purpose of positioning and/or supporting the patient.

The lighting apparatus is designed to light the patient receiving region. To this end, the lighting apparatus has at least one lighting unit with a lighting element. The at least one lighting element can preferably comprise an LED (light emitting diode). The lighting apparatus, in particular the lighting unit, has two neutralizing elements, wherein the two neutralizing elements are provided and/or designed to at least partially neutralize and/or reduce a voltage that is induced by the magnetic field, in particular by the HF field of the scanner unit, in particular an induced interference voltage at the at least one lighting element. The two neutralizing elements are preferably arranged and/or connected in parallel with the at least one lighting element.

The lighting apparatus can comprise a single lighting unit or two or more lighting units in this case. If the lighting apparatus has more than one lighting unit, the individual lighting units of the lighting apparatus are preferably so designed as to be structurally identical.

An interference voltage applied to the at least one lighting element can cause, for example, fluttering and/or flickering of the at least one lighting element. This can in turn also contribute to unsettling the patient during a magnetic resonance examination of the patient. By means of the two neutralizing elements, it is advantageously possible to reduce and/or suppress an induced interference voltage at the at least one lighting element. It is consequently also possible to provide interference-free lighting of the patient receiving region during a magnetic resonance examination. It is therefore also possible by means of the disclosed lighting apparatus to assist with settling the patient during a magnetic resonance examination.

In an advantageous development of the magnetic resonance apparatus, provision can be made for at least one of the two neutralizing elements to comprise a capacitor. Preferably, each of the two neutralizing elements comprises a capacitor. As a result of the circuit, an area is covered between the lighting element and the neutralizing element, in particular the capacitor. This area covered is penetrated by the HF field and an unwanted voltage, in particular an interference voltage, is induced and/or produced in this case. By means of the two capacitors, it is advantageously possible to reduce these unwanted voltages, in particular interference voltages, directly at the lighting element. Interference-free operation of the at least one lighting element in the HF field of the magnetic resonance apparatus can be achieved thereby. In particular, it is possible in this way to operate the at least one lighting element in an interference-free manner while directing an HF field into the patient receiving region.

By means of the neutralizing elements, in particular neutralizing elements in the form of capacitors, a voltage is induced within the HF field, wherein it is advantageously possible to compensate such an induced voltage using an arrangement of two neutralizing elements, in particular comprising two capacitors. It is thereby advantageously possible to compensate a side effect, in particular a voltage which is induced in the HF field and is applied to the at least one lighting element, said side effect being produced by the arrangement of a neutralizing element, in particular a capacitor, within the lighting circuit for the purpose of reducing a voltage that is induced by the HF field, by the arrangement of two neutralizing elements, in particular two capacitors. In particular, voltages coupled into the lighting apparatus can thus be reduced by at least a factor of 5. In a particularly advantageous aspect, voltages coupled into the lighting apparatus can thus be reduced by at least a factor of 8. In a particularly advantageous aspect, voltages coupled into the lighting apparatus can thus be reduced by at least a factor of 10.

In an advantageous development of the magnetic resonance apparatus, provision can be made for the at least one capacitor to have a maximum capacitance of 100 nF. In a particularly advantageous aspect, the at least one capacitor has a maximum capacitance of 50 nF. In a particularly advantageous aspect, the at least one capacitor has a maximum capacitance of 20 nF. In a particularly advantageous aspect, the at least one capacitor has a capacitance 10 nF. In this way, a resonant frequency of an unwanted oscillating circuit which is generated and/or formed by the capacitor in the HF field of the scanner unit can have a sufficiently large separation from a magnetic resonance frequency. It is advantageously possible thus to reduce and/or prevent a resonance step-up of a circulating current of the oscillating circuit. At the same time, it is also advantageously possible to reduce and/or prevent overheating and/or adverse warming of components of the oscillating circuit and/or the lighting apparatus. Moreover, it is also possible in this way to reduce and/or prevent local $B_1$ inhomogeneities in the $B_1$ field. In principle, it is however also possible to use a capacitance of less than 10 nF, e.g. a capacitance of 1 nF.

In an advantageous development of the magnetic resonance apparatus, provision can be made for a first neutralizing element of the two neutralizing elements to be connected upstream of the at least one lighting element and a second neutralizing element of the two neutralizing elements to be connected downstream of the at least one lighting element. In particular, the at least one lighting element is arranged and/or connected in parallel with the first neutralizing element and the second neutralizing element within a lighting circuit of the lighting apparatus. As a result of this, a voltage is induced within the HF field by each neutralizing element, e.g. by a capacitor in each case, wherein the two voltages can advantageously compensate and/or offset each other at least partially. This allows in particular a reduction of an interference voltage applied to the at least one lighting element, and consequently also interference-free operation of the at least one lighting element during a magnetic resonance examination. At the same time, any expense involved in product support can also be reduced. In particular, the lighting apparatus can be less dependent on the precise characteristics (e.g. of a charge carrier life) of a lighting element, in particular an LED. It is therefore also possible to reduce any risk of having to select and use new components for the lighting unit.

In an advantageous development of the magnetic resonance apparatus, provision can be made for the two neutralizing elements to be of structurally identical design. In particular, the two neutralizing elements each have a capacitor. In addition, the two capacitors can have the same capacitance. It is thereby possible in particular to advantageously compensate and/or neutralize the voltages which are induced in the HF field by the capacitors and applied to the at least one lighting element.

If field inhomogeneities are present or known, however, the two capacitors can also have different capacitances in order to achieve a neutralization of the voltages induced in the HF field at the lighting element. It is thereby possible in a particularly advantageous manner to compensate and/or offset an induced voltage that is applied to the at least one lighting element.

In an advantageous development of the magnetic resonance apparatus, provision can be made for the at least one lighting element to have an LED. In this way, a particularly economical lighting element can be provided for the purpose of lighting the patient receiving region.

In an advantageous development of the magnetic resonance apparatus, provision can be made for the lighting apparatus to be arranged at least partially inside the patient receiving region and/or inside an opening of the scanner unit. The opening of the scanner unit preferably comprises the patient receiving region in this case. In particular, the lighting apparatus in this case can also be arranged at least partially on a shell of the scanner unit, which shell surrounds the patient receiving region. Direct lighting of the patient receiving region can be achieved in this way and it is therefore also possible to dispense with light-transmitting elements which transmit a light from outside the patient receiving region into the patient receiving region for the purpose of lighting.

BRIEF DESCRIPTION OF THE DRAWINGS

Further advantages, features and details of the disclosure are derived from the exemplary aspect described below and with reference to the drawings, in which.

DETAILED DESCRIPTION

Figure 1:
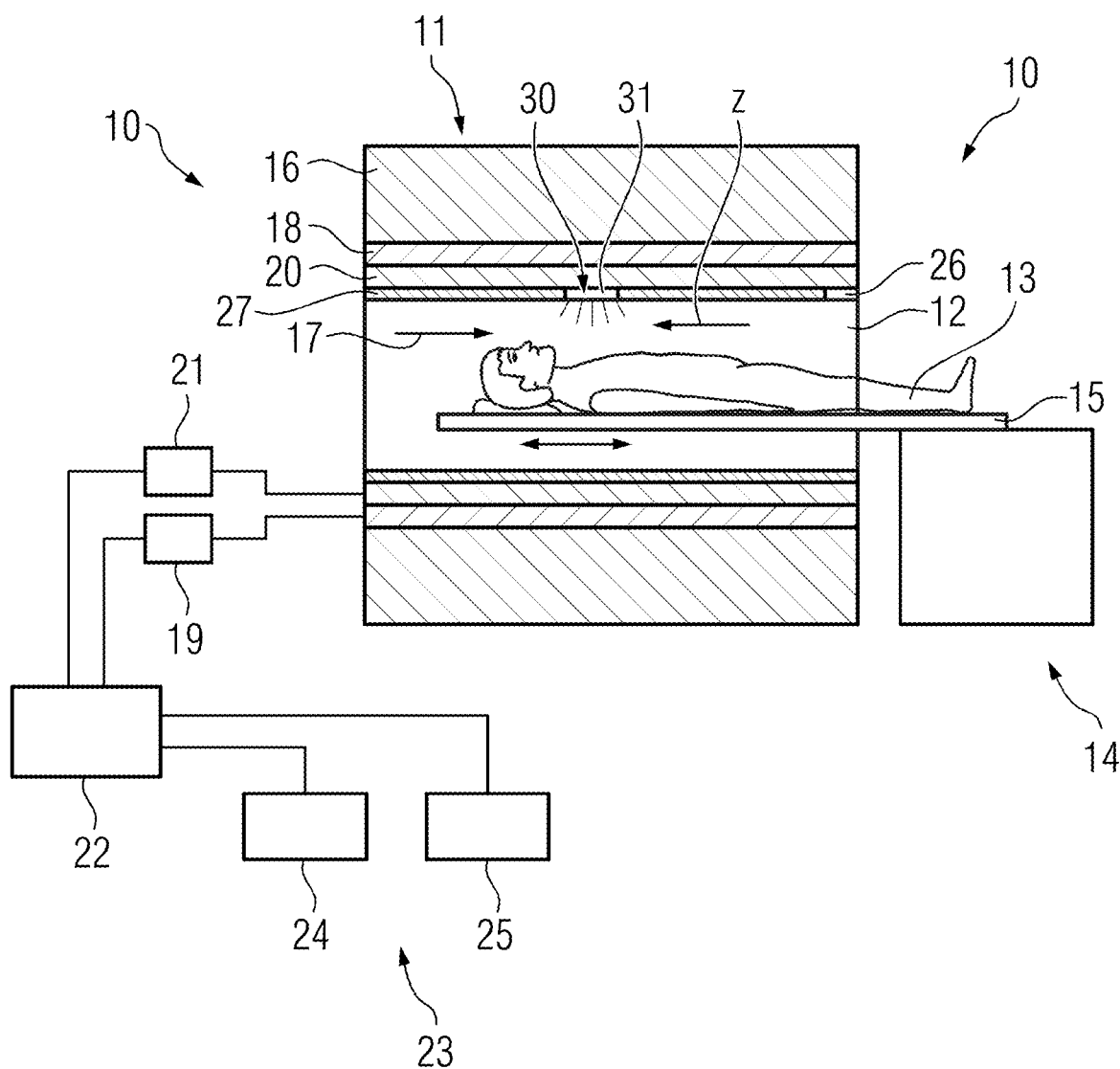
FIG. 1 shows an magnetic resonance apparatus with a lighting apparatus in accordance with aspects of the disclosure in a schematic illustration.

FIG. 1 schematically illustrates a magnetic resonance apparatus 10. The magnetic resonance apparatus 10 comprises a scanner unit 11 which consists essentially of a magnet unit. The magnetic resonance apparatus 10 also has a patient receiving region 12 for receiving a patient 13. The patient receiving region 12 in the present exemplary aspect is cylindrical and is surrounded in a circumferential direction by the scanner unit 11, in particular by the magnet unit. However, a different design of the patient receiving region 12 is readily conceivable. The patient 13 can be pushed and/or moved into the patient receiving region 12 by means of a patient support apparatus 14 of the magnetic resonance apparatus 10. To this end, the patient support apparatus 14 has a patient table 15 which is so embodied as to be mobile within the patient receiving region 12. In particular, the patient table 15 here is so supported as to be mobile in the direction of a longitudinal extension of the patient receiving region 12 and/or in a z-direction.

The scanner unit 11, in particular the magnet unit, comprises a superconductive basic magnet 16 for the purpose of generating a strong homogeneous and in particular constant basic magnetic field 17. The scanner unit 11, in particular the magnet unit, also has a gradient coil unit 18 for the purpose of generating magnetic field gradients that are used for spatial encoding during imaging. The gradient coil unit 18 is controlled by means of a gradient control unit 19 of the magnetic resonance apparatus 10. The scanner unit 11, in particular the magnet unit, further comprises a high-frequency antenna unit 20 for the purpose of exciting a polarization which occurs in the basic magnetic field 17 generated by the basic magnet 16. The high-frequency antenna unit 20 is controlled by a high-frequency antenna control unit 21 of the magnetic resonance apparatus 10 and directs high-frequency magnetic resonance sequences into the patient receiving region 12 of the magnetic resonance apparatus 10. A high-frequency field (HF field) is thus generated within the patient receiving region.

For the purpose of controlling the basic magnet 16, the gradient control unit 19 and the high-frequency antenna control unit 21, the magnetic resonance apparatus 10 has a system control unit 22. The system control unit 22 controls the magnetic resonance apparatus centrally, e.g. performing a predefined imaging gradient echo sequence. In addition, the system control unit 22 comprises an evaluation unit (not shown in greater detail) for the purpose of evaluating medical image data that is captured during the magnetic resonance examination.

The magnetic resonance apparatus 10 further comprises a user interface 23 which is connected to the system control unit 22. Control information, e.g. imaging parameters, and reconstructed magnetic resonance images can be displayed on a display unit 24, e.g. on at least one monitor, of the user interface 23 for a medical operator. The user interface 23 also has an input unit 25 by means of which information and/or parameters can be entered by the medical operator during a measuring operation.

For the purpose of lighting the patient receiving region 12, the magnetic resonance apparatus 10 has a lighting apparatus 30. The lighting apparatus 30 has at least one lighting unit 31. In FIG. 1, the lighting apparatus 30 is illustrated with a single lighting unit 31. The lighting apparatus 30 is however not restricted to a design with a single lighting unit 31, and the lighting apparatus 30 can also have two or more lighting units 31, these being arranged at different locations within the patient receiving region 12, for example.

The lighting apparatus 30 and/or the lighting unit 31 is arranged within an opening 26 of the scanner unit 11. The opening 26 of the scanner unit 11 comprises the patient receiving region 12. The opening 26 of the scanner unit 11 also comprises a shell 27 which surrounds the patient receiving region 12. In this case the lighting apparatus 30, in particular the lighting unit 31, is arranged on the shell 27 surrounding the opening 26. In this case the lighting apparatus 30, in particular the lighting unit 31, can be arranged on the shell 27, e.g. in a recess of the shell 27. The lighting apparatus 30, in particular the lighting unit 31, is moreover preferably arranged on the shell 27 in such a way that lighting and/or a light emitted by the lighting apparatus 30, in particular the lighting unit 31, shines directly into the patient receiving region 12. Alternatively or additionally, the lighting apparatus 30, in particular the lighting unit 31, can be arranged on a side of the shell 27 which faces towards the patient receiving region 12, such that the lighting apparatus 30, in particular the lighting unit 31, is arranged within the patient receiving region 12.

Figure 2:
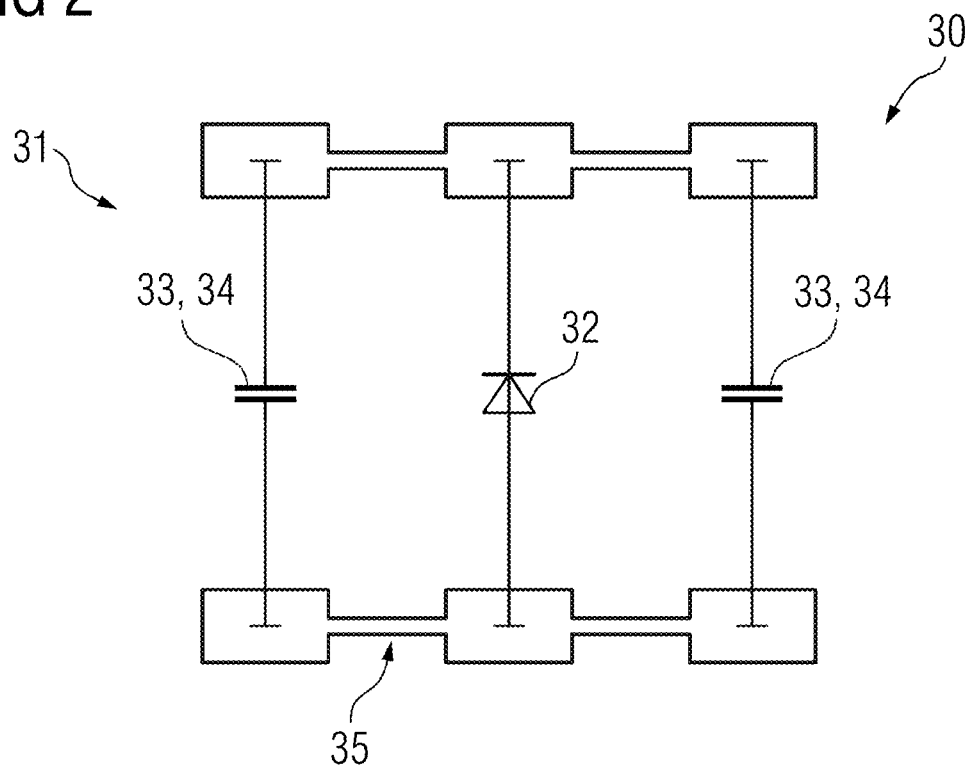
FIG. 2 shows the lighting apparatus integrated on a circuit board in a schematic illustration.
Figure 3:
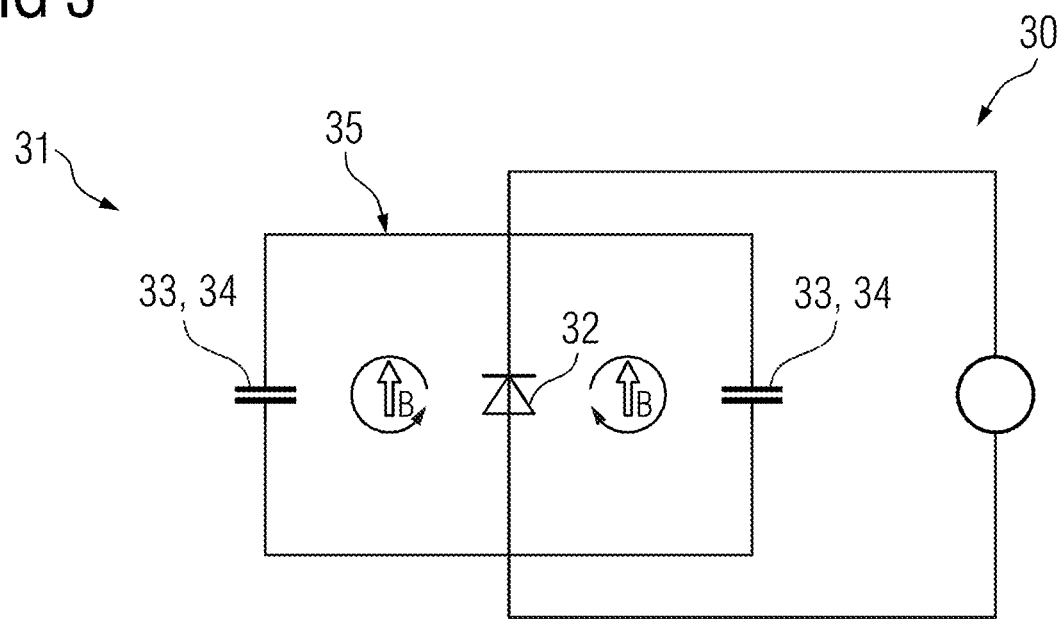
FIG. 3 shows the lighting apparatus with induced interference voltages.

FIGS. 2 and 3 illustrate the lighting apparatus 30, in particular the lighting unit 31, in greater detail. The lighting unit 31 is arranged on a circuit board as illustrated in FIG. 2. The lighting unit 31 has a lighting element 32. The lighting element 32 in the present exemplary aspect takes the form of an LED. In addition, the lighting unit 31 has at least two neutralizing elements 33.

The two neutralizing elements 33 are configured and/or designed to neutralize a voltage that is induced within the lighting apparatus 30, in particular the lighting unit 31, by a magnetic field, in particular the HF field of the scanner unit 11. In particular, the two neutralizing elements 33 are configured and/or designed to neutralize the interference voltage that is induced at the lighting element 32, in particular the LED, by the magnetic field, in particular the HF field of the scanner unit 11.

The two neutralizing elements 33 each have a capacitor 34. Each of the two capacitors 34 has a maximum capacitance of 100 nF. In a particularly advantageous aspect, at least one of the two capacitors 34 has or possibly both capacitors 34 have a maximum capacitance of 50 nF. In a particularly advantageous aspect, at least one of the two capacitors 34 has or possibly both capacitors 34 have a maximum capacitance of 20 nF. In a particularly advantageous aspect, at least one of the two capacitors 34 has or possibly both capacitors 34 have a capacitance of 10 nF. In principle, the capacitance of at least one of the two capacitors 34 or possibly both capacitors 34 can be less than 10 nF. It is also readily conceivable for at least one of the two capacitors 34 or possibly both capacitors 34 to have a capacitance of 1 nF or even 2 nF, for example.

Owing to the formation of the HF field as a homogeneous magnetic field, the two capacitors 34 are structurally identical in design. In particular, the two capacitors 34 have an identical capacitance here. If the formation of the magnetic field, in particular the HF field, is not homogeneous, the two capacitors 34 can also be designed to have different capacitances.

The lighting unit 31 is designed in such a way that the lighting element 32, in particular the LED, and the two capacitors 34 are connected in parallel within the lighting unit 31, in particular in a lighting circuit 35. According to the disclosure, a first capacitor 34 of the two capacitors 34 is so arranged as to be connected upstream of the lighting element 32, in particular the LED. Furthermore, a second capacitor 34 of the two capacitors 34 is so arranged as to be connected downstream of the lighting element 32, in particular the LED (FIGS. 2 and 3).

As a result of using neutralizing elements 33, in particular capacitors 34, in the lighting apparatus 30 described above, in the particular lighting unit 31, it is advantageously possible to reduce and/or compensate voltages that are coupled into the lighting unit 31.

Furthermore, as a result of the symmetrical arrangement of the two capacitors 34 relative to the lighting element 32, in particular the LED, within the lighting oscillating circuit 35, voltages resulting from the magnetic field, in particular the HF field, are induced which mutually offset and/or compensate each other in each case (FIG. 3).

Furthermore, the use of capacitors 34 with such a capacitance value prevents the occurrence of a resonance step-up of a circulating current of an oscillating circuit which is formed and/or generated by means of the capacitor 34 in the HF field of the scanner unit 11. A sufficiently large separation from the magnetic resonance frequency is therefore established, so that overheating and/or adverse warming of components of the oscillating circuit and/or lighting apparatus 30 are also reduced and/or prevented.

The illustrated magnetic resonance apparatus 10 can obviously comprise further components which are conventionally found in magnetic resonance apparatuses 10. The general functioning of a magnetic resonance apparatus 10 is moreover known to a person skilled in the art and therefore a detailed description of the further components is not required.

Although the disclosure is illustrated and described in detail by the preferred exemplary aspect, the disclosure is not restricted by the examples disclosed here, and other variations may be derived therefrom by a person skilled in the art without departing from the scope of the disclosure.

The invention claimed is:

1. A magnetic resonance apparatus comprising:
   a scanner;
   a patient receiving region which is at least partially surrounded by the scanner; and
   a lighting apparatus configured to illuminate the patient receiving region, wherein the lighting apparatus comprises:
      a lighting element;
      a first capacitor; and
      a second capacitor,
   wherein the first capacitor and the second capacitor are arranged symmetrically about the lighting element, and
   wherein the symmetrical arrangement of the first capacitor and the second capacitor about the lighting element results in a mutual offset of voltages induced in the lighting apparatus by a high-frequency field generated by the scanner.

2. The magnetic resonance apparatus as claimed in claim 1, wherein each of the first capacitor and the second capacitor has a maximum capacitance of 100 nF.

3. The magnetic resonance apparatus as claimed in claim 1, wherein the first capacitor is connected upstream of the lighting element, and
   wherein the second capacitor is connected downstream of the lighting element.

4. The magnetic resonance apparatus as claimed in claim 1, wherein the first and the second capacitor are configured to be structurally identical.

5. The magnetic resonance apparatus as claimed in claim 1, wherein the lighting element comprises a light-emitting diode (LED).

6. The magnetic resonance apparatus as claimed in claim 1, wherein the lighting apparatus is arranged at least partially inside the patient receiving region and/or inside an opening of the scanner.

7. The magnetic resonance apparatus as claimed in claim 1, wherein the first capacitor, the second capacitor, and the lighting element are electrically connected to one another in parallel.

8. The magnetic resonance apparatus as claimed in claim 1, wherein the first capacitor and the lighting element form a first half of a lighting oscillating circuit, and
   wherein the second capacitor and the lighting element form a second half of the lighting oscillating circuit.

9. The magnetic resonance apparatus as claimed in claim 8, wherein a first current flowing in the first half of the lighting oscillating circuit that is induced by the high-frequency field generated by the scanner flows counter to a second current flowing in the second half of the lighting oscillating circuit that is induced by the high-frequency field generated by the scanner.

10. The magnetic resonance apparatus as claimed in claim 8, wherein a resonant frequency of the lighting oscillating circuit is separated from a magnetic resonance frequency of the scanner to prevent a resonance step-up of a circulating current of the lighting oscillating circuit.

11. A lighting apparatus configured to illuminate a patient receiving region that is at least partially surrounded by a scanner of a magnetic resonance apparatus, the lighting apparatus comprising:
    a lighting element;
    a first capacitor; and
    a second capacitor,
    wherein the first capacitor and the second capacitor are arranged symmetrically about the lighting element, and
    wherein the symmetrical arrangement of the first capacitor and the second capacitor about the lighting element results in a mutual offset of voltages induced in the lighting apparatus by a high-frequency field generated by the scanner.

12. The lighting apparatus as claimed in claim 11, wherein each of the first capacitor and the second capacitor has a maximum capacitance of 100 nF.

13. The lighting apparatus as claimed in claim 11, wherein the first capacitor is connected upstream of the lighting element, and
    wherein the second capacitor is connected downstream of the lighting element.

14. The lighting apparatus as claimed in claim 11, wherein the first and the second capacitor are configured to be structurally identical.

15. The lighting apparatus as claimed in claim 11, wherein the lighting element comprises a light-emitting diode (LED).

16. The lighting apparatus as claimed in claim 11, wherein the lighting apparatus is arranged at least partially inside the patient receiving region and/or inside an opening of the scanner.

17. The lighting apparatus as claimed in claim 11, wherein the first capacitor, the second capacitor, and the lighting element are electrically connected to one another in parallel.

18. The lighting apparatus as claimed in claim 17, wherein a first current flowing in the first half of the lighting oscillating circuit that is induced by the high-frequency field generated by the scanner flows counter to a second current flowing in the second half of the lighting oscillating circuit that is induced by the high-frequency field generated by the scanner.

19. The lighting apparatus as claimed in claim 17, wherein a resonant frequency of the lighting oscillating circuit is separated from a magnetic resonance frequency of the scanner to prevent a resonance step-up of a circulating current of the lighting oscillating circuit.

20. The lighting apparatus as claimed in claim 11, wherein the first capacitor and the lighting element form a first half of a lighting oscillating circuit, and wherein the second capacitor and the lighting element form a second half of the lighting oscillating circuit.

* * * * *